(12) United States Patent
Rengarajan et al.

(10) Patent No.: US 7,755,949 B2
(45) Date of Patent: Jul. 13, 2010

(54) RESET CIRCUIT FOR TERMINATION OF TRACKING CIRCUITS IN SELF TIMED COMPILER MEMORIES

(75) Inventors: Krishnan S Rengarajan, Karnataka (IN); Rashmi Sachan, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 12/197,236

(22) Filed: Aug. 23, 2008

(65) Prior Publication Data

US 2010/0046309 A1 Feb. 25, 2010

(51) Int. Cl.
*G11C 16/06* (2006.01)
(52) U.S. Cl. .................................. 365/185.25; 365/203
(58) Field of Classification Search ............ 365/185.25, 365/203
See application file for complete search history.

(56) References Cited

U.S. PATENT DOCUMENTS 7,234,034 B2 * 6/2007 Spriggs et al. .............. 711/167

* cited by examiner

*Primary Examiner*—Hoai V Ho
*Assistant Examiner*—Jason Lappas
(74) *Attorney, Agent, or Firm*—Dawn V. Stephens; Wade James Brady, III; Frederick J. Telecky, Jr.

(57) ABSTRACT

A method and circuit for termination of internal cycle and its associated tracking circuits in high performance self timed compiler memories is disclosed. In one embodiment, a method of timing the precharging of BLs in a self timed compiler memory array includes initiating an internal clock during the start of a read/write cycle by a control block, triggering DWL and WLs to go high upon initiating the internal clock by the control block, triggering DBL and BLs to go low upon the DWL and WLs going high by the control block, generating a reset BL signal upon the DWL going high and the DBL going low by the tracking circuit, disabling the DBL from going further low upon receiving the reset BL signal by the tracking circuit, and precharging the DBL to go high upon receiving the reset BL signal by the precharge circuit.

10 Claims, 6 Drawing Sheets

RESET CIRCUIT FOR TERMINATION OF TRACKING CIRCUITS IN SELF TIMED COMPILER MEMORIES

TECHNICAL FIELD OF THE INVENTION

The present invention relates generally to memories, and more particularly relates to self timed compiler memories.

BACKGROUND

A computer system, communication device, and other devices rely on memory to store instructions and data that are processed to perform various tasks. Substantial advances have been made over the years in both storage capacity and speed of memory devices for use in such applications. However, in some cases the speed of the memory has not kept pace with speed increases achieved with processors or other chips within the same system. Many applications require a memory device to be clocked at its maximum possible cycle time.

Figure 1:
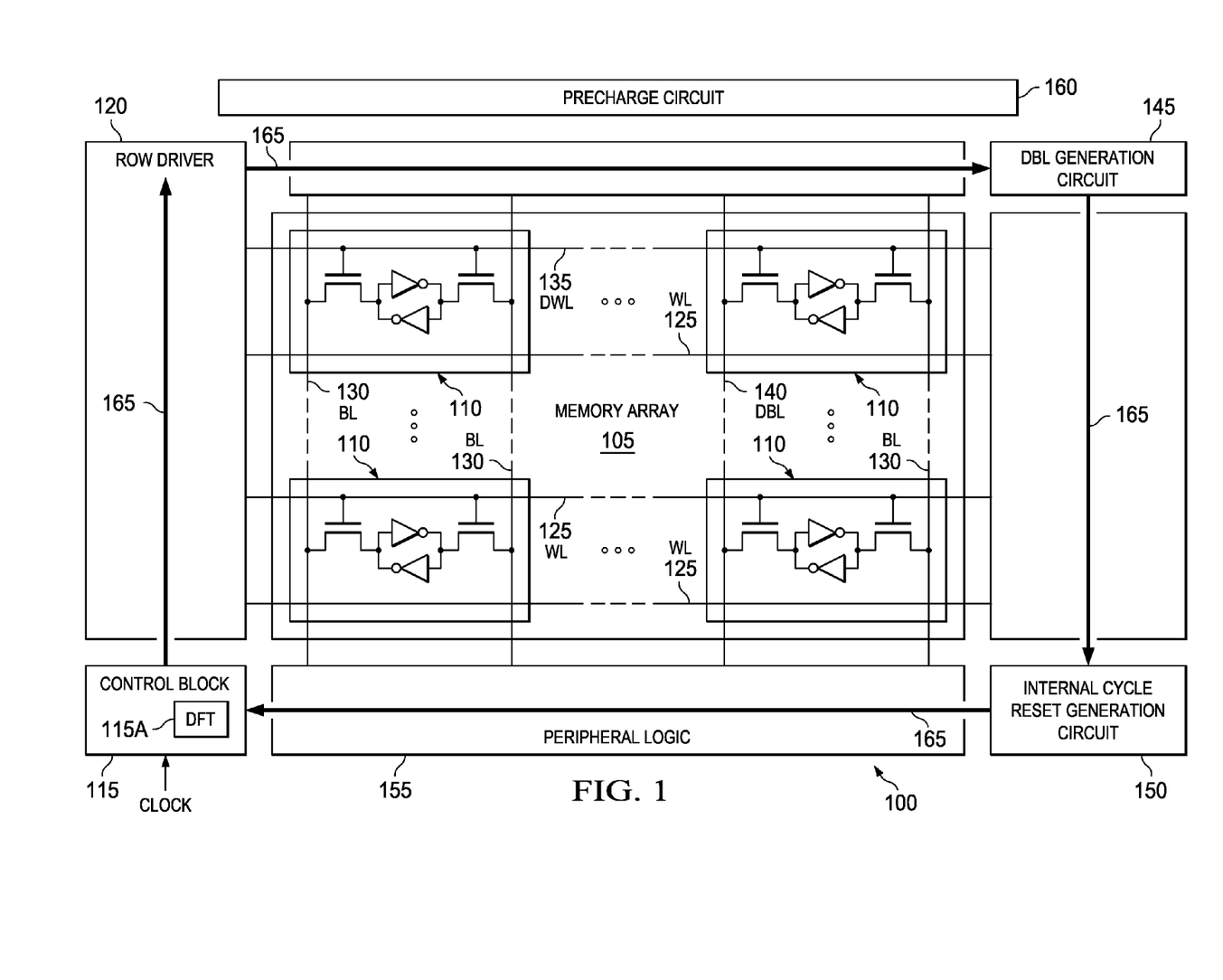
FIG. 1 illustrates a conventional block diagram of a self timed compiler memory.

A memory array 105 contains an array of memory cells 110 connected to each other by row and column lines as shown in a self timed compiler memory device 100 illustrated in FIG. 1. Further as shown in FIG. 1, each row in the array of memory cells 110 is connected to a wordline (WL) 125 and each column in the array of memory cells 110 is connected to a bitline (BL) 130. Typically, before the wordlines (WLs) 125 in the array of memory cells 110 are activated, the bitlines (BLs) 130 are precharged. The memory device 100 has a timing circuit to determine when the BLs 130 have been completely precharged.

Also shown in FIG. 1, is a control block 115 including a design for test (DFT) 115A. Also, a row driver 120 drives a row of the memory cell 110 based on an internal clock generated by the control block 115. Further, a tracking circuit is used to set timing for a peripheral logic 150 turn on, based on a differential build up on the BLs 130 after the WLs 125 are turned on. For example, the peripheral logic 150 includes a sense amplifier, a write driver and/or a data latch. The tracking circuit includes a dummy WL (DWL) 135, an associated dummy BL (DBL) 140 and a DBL generation circuit 145. An internal clock at the tracking circuit triggers a signal, upon receiving the internal clock from the control block 115 that travels via the DWL 135, which in turn triggers the DBL 140 and travels back to the tracking circuit. This initiates a cycle reset process (e.g., the cycle path is shown by directional arrows 165 in FIG. 1), which turns on the BL 130 and a precharge circuit 160 precharges bitlines to prepare for a next read cycle.

Figure 2:
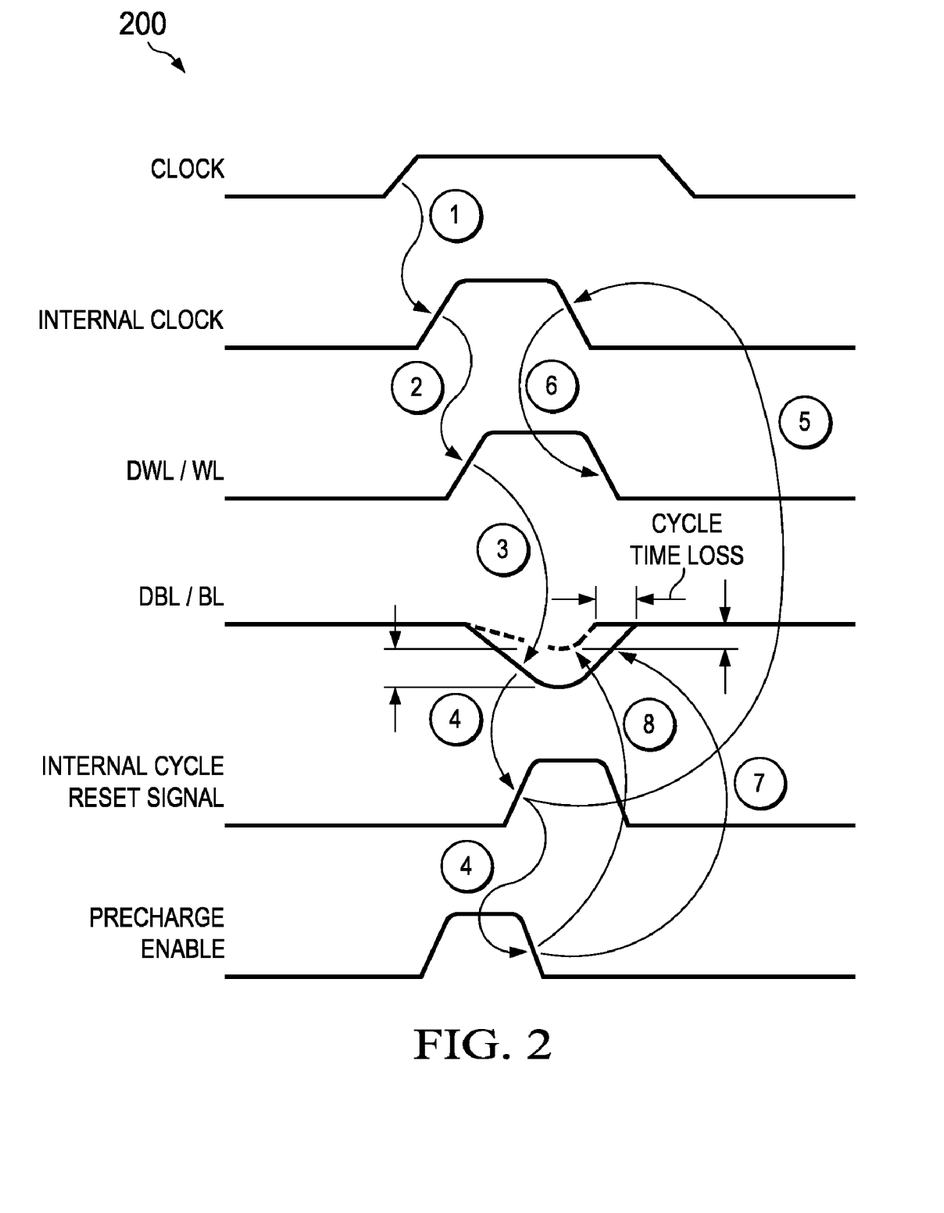
FIG. 2 is a timing diagram illustrating typical discharging patterns of a bitline (BL) and a dummy bitline (DBL) in a typical read cycle of a self timed compiler memory, such as those shown in FIG. 1.

It can be seen in the timing diagram 200 shown in FIG. 2 that during a read cycle, the BLs 130 are discharged only to a small extent (about 100 milli-volts) because of small size of transistors in memory cells. This small difference in BLs 130 is sensed through a sense amplifier. However, during the same read cycle, the logic low of the DBL 140 can go to zero much faster than the logic low of BLs 130, as discharge transistor sizes are multiple of transistor size of a single memory cell transistor. For example, the discharge driver transistor for the BL 130 is small (in order to keep area small) and hence the BL 130 discharges lower. However, as discharge transistors for the DBL 140 are in multiples of driver transistors size of memory cell 110, the DBL 140 discharges faster. It can be seen that precharging the DBL 140 back to logic high for the next read cycle can take a significantly longer time than time required to precharge the BL 130 back to the logic high. It can also be seen that this can significantly limit memory device cycle time as the BLs 130 would have precharged back to logic high at a significantly faster rate than the DBL 140 (as the BLs 130 do not discharge all the way to logic low of zero).

SUMMARY

A novel technique for termination of a tracking circuit in self timed compiler memories is disclosed. According to an aspect of the present invention, a self timed compiler memory array includes a memory array including a plurality of bitlines (BLs) and a plurality of wordlines (WLs), a peripheral logic coupled to the memory array via the BLs, a control block coupled to the peripheral logic for initiating an internal clock during the start of a read cycle, a tracking circuit including a dummy bitline (DBL) and an associated dummy wordline (DWL), and a precharge circuit coupled to the BLs and the DBL.

Further, the DWL and the WL go high upon the internal clock going high, which in turn triggers the DBL and the BLs to go low. The tracking circuit then generates a reset BL signal upon the DWL going high and DBL going low. Further, the generated reset BL signal stops the DBL from going further low and triggers the precharge circuit to precharge the DBL to go high. In addition, the reset BL signal starts an internal cycle reset signal which in turn resets the internal clock and enables precharging of the BLs.

Further, the tracking circuit includes a DBL generation circuit to generate the DBL signal and the DWL signal with a fixed delay upon the internal clock going high, and the DWL going high. The tracking circuit also includes a DWL reset generation circuit to generate the reset BL signal upon receiving the DBL signal and upon the DWL going high.

The methods, systems and apparatuses disclosed herein may be implemented in any means for achieving various aspects, and other features will be apparent from the accompanying drawings and from the detailed description that follows.

BRIEF DESCRIPTION OF THE DRAWINGS

Embodiments of the present invention are illustrated by way of an example and not limited to the figures of the accompanying drawings, in which like references indicate similar elements and in which.

Other features of the present embodiments will be apparent from the accompanying drawings and from the detailed description that follows.

DETAILED DESCRIPTION

A novel technique for termination of a tracking circuit in self timed compiler memories is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The terms "DBL" and "DBL signal" are used interchangeably throughout the document. Also, the terms "DWL" and "DWL signal" are used interchangeably throughout the document.

Figure 3:
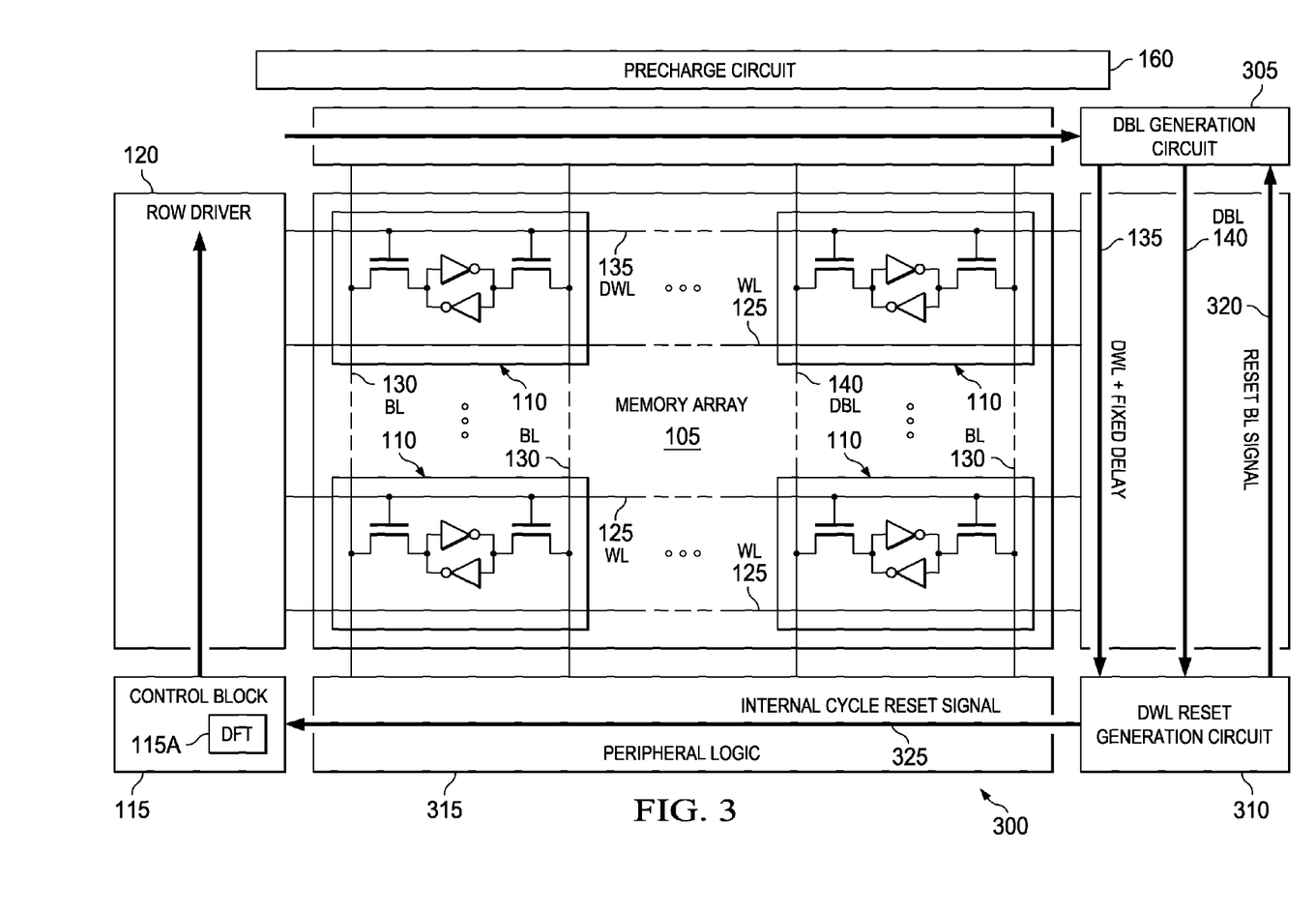
FIG. 3 is a block diagram of a self timed compiler memory array, according to an embodiment of the present invention.

FIG. 3 is a block diagram of a self timed compiler memory array 300, according to an embodiment of the present invention. Particularly, FIG. 3 illustrates a memory array 105 including an array of memory cells 110 connected to each other by row and column lines as shown in the self timed compiler memory array 300. Further as shown in FIG. 3, each row in the array of memory cells 110 is connected to a wordline (WL) (e.g., the wordlines 125) and each column in the array of memory cells 110 is connected to a bitline (BL) (e.g., the bitlines 130). Further as shown in FIG. 3, the self timed compiler memory array 300 includes a control block 115, a precharge circuit 160, a row driver 120, a DBL generation circuit 305, a DWL reset generation circuit 310, and a peripheral logic 315. In one example embodiment, the control block 115 includes a design for test (DFT) 115A and the peripheral logic 315 includes a sense amplifier and/or a data control circuit.

Further as shown in FIG. 3, the memory array 105 includes the memory cells 110 which are organized into at least one rectangular array having a plurality of rows, and each row has a plurality of memory cells 110. In some embodiments, the memory array 105 is arranged to include (n×m) memory cells 110 which has n number of rows and m number of columns. As shown in FIG. 3, each memory cell 110 has an associated wordline (WL) 125 and a bitline (BL) pair 130.

In one example embodiment, each memory cell 110 also includes a pair of back to back inverters, and a pair of transistors as shown in the memory cell 110. As shown in FIG. 3, the WL 125 runs horizontally through the memory cell 110. Further, a pair of BL 130 and an associated complement BL 130 runs vertically through the memory cell 110.

In one exemplary implementation, the self timed compiler memory array 300 includes the memory array 105 including the plurality of bitlines (BLs) 130 and the plurality of wordlines (WLs) 125. The self timed compiler memory array 300 also includes the peripheral logic 315 coupled to the memory array 105 via the BLs 130. Further, the self timed compiler memory array 300 includes the control block 115 coupled to the peripheral logic 315 to initiate an internal clock during the start of a read cycle. Also, the self timed compiler memory array 300 includes the tracking circuit including a dummy bitline (DBL) 140 and an associated dummy wordline (DWL) 135. In addition, the self timed compiler memory array 300 includes the precharge circuit 160 coupled to the BLs 130 and the DBL 140.

In operation, the control block 115 initiates the internal clock during the start of a read cycle. The control block 115 then triggers the WLs 125 and the DWL 135 to go high upon the internal clock going high. Further, the control block triggers the BLs 130 and the DBL 140 to go low upon DWL 135 and WLs 125 going high.

Further in operation, the tracking circuit generates a reset BL signal 320 upon the DWL 135 going high and the DBL 140 going low. The tracking circuit then stops the DBL 140 from going further low upon receiving the reset BL signal 320. The precharge circuit 160 then precharges the DBL 140 to go high upon receiving the reset BL signal 320. The tracking circuit then generates an internal cycle reset signal 325 upon receiving the reset BL signal, which in turn resets the internal clock.

The tracking circuit then turns on a BL precharge enable upon receiving the internal cycle reset signal 325 which enables precharging of the BLs 130. In one exemplary implementation, the tracking circuit includes the DBL generation circuit 305, the DWL reset generation circuit 310, the DWL 135 and the DBL 140. In one example embodiment, the DBL generation circuit 305 generates the DBL signal 140 and the DWL signal 135 with a fixed delay upon the internal clock going high and upon the DWL 135 going high. Further, the DWL reset generation circuit 310 generates the reset BL signal 320 upon receiving the DBL signal 140 and upon the DWL 135 going high.

As mentioned above, the reset BL signal 320 starts the internal cycle reset signal which in turn resets the internal clock and also turns on the BL precharge enable. The precharge circuit 160 enables precharging of the BLs 130 upon turning on the BL precharge enable.

In accordance with the above described embodiments, the operational aspects associated with the self timed compiler memory array 300 are as follows. Once the DBL toggle is sensed at the bottom end of the BL, the information is propagated through local buffers to turn on the peripheral logic 315 (i.e., sense amplifier). The DBL 140 is reset soon after, rather than wait for the reset command from the control block 115 which comes much later through the DWL 135. Hence, this earlier local reset, based on sensing the BL discharge, (but after ensuring peripheral logic 315 control signal propagation), takes this path (i.e., the path that comes through the DWL 135) out of the cycle time calculations. In one example embodiment, the above mentioned technique uses delay chain based circuits to ensure that the DBL 140 is reset, without affecting the forward propagation of the tracking information to the control block 115 through the internal cycle reset signal 325. The above mentioned technique also works well across a wide range of memory arrays.

Figure 4:
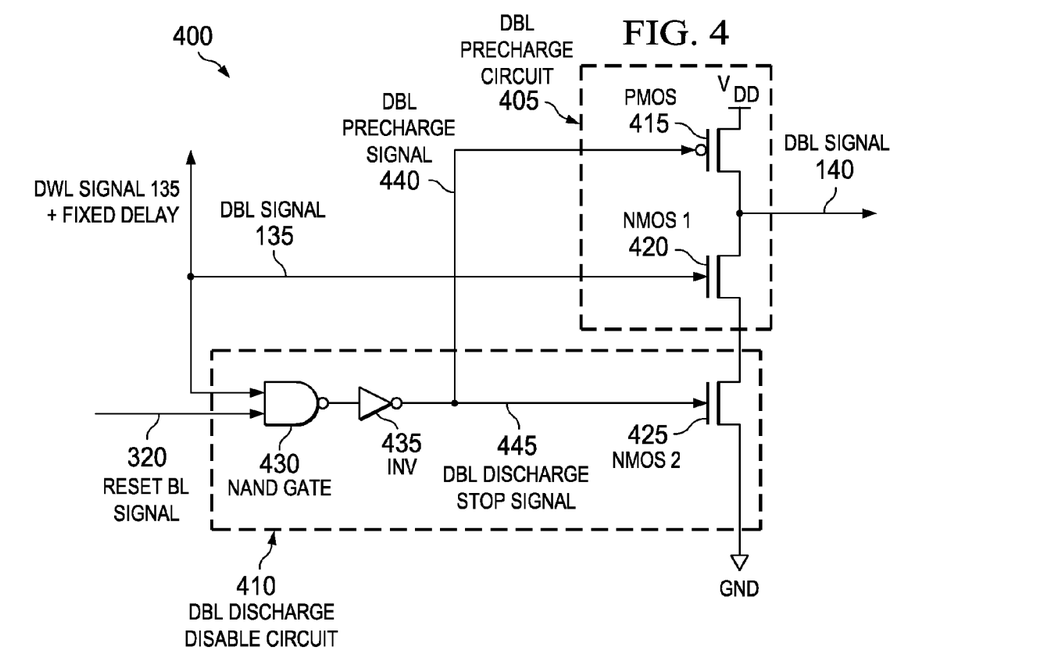
FIG. 4 is a circuit diagram of the DBL generation circuit of FIG. 3, according to an embodiment.

FIG. 4 is a circuit diagram 400 of the DBL generation circuit 305 of FIG. 3, according to an embodiment. Particularly, FIG. 4 illustrates a DBL precharge circuit 405, and a DBL discharge disable circuit 410. As shown in FIG. 4, the DBL generation circuit 305 includes the DBL precharge circuit 405 to output the DBL signal 140 upon receiving the DWL signal 135. In one exemplary implementation, the DBL precharge circuit 405 includes a PMOS transistor 415, and a first NMOS transistor (NMOS 1) 420. Each of the PMOS transistor 415 and the first NMOS transistor (NMOS 1) 420 includes a source terminal, a drain terminal and a gate terminal.

In one exemplary implementation, the source terminal of the PMOS transistor 415 is coupled to a positive power supply $V_{DD}$. Further, the drain terminal of the NMOS 1 420 is coupled to the drain terminal of the PMOS transistor 415. In addition, the gate terminal of the NMOS 1 420 is configured to receive the DWL signal 135. In one example embodiment, the DBL signal 140 is outputted at the drain node of the PMOS transistor 415 of the DBL precharge circuit 405.

Further as shown in FIG. 4, the DBL generation circuit 305 includes the DBL discharge disable circuit 410 (i.e., coupled to the DBL precharge circuit 405) to output a DBL discharge stop signal 445 (also referred as DBL precharge signal 440) upon receiving the reset BL signal 320 from the DWL reset generation circuit 310. In one embodiment, the DBL precharge circuit 405 stops further discharging of the DBL 140 upon receiving DBL discharge stop signal 445 from the DBL discharge disable circuit 410. In one exemplary implementation, the DBL discharge disable circuit 410 includes a NAND gate 430, an inverter (INV) 435, and a second NMOS transistor (NMOS 2) 425.

In one example embodiment, the NAND gate 430 includes a first input, a second input and an output, such that the first input of the NAND gate 430 receives the DWL signal 135, and the second input of the NAND gate 430 receives the reset BL signal 320 (e.g., from the DWL reset generation circuit 310). Further, the INV 435 includes an input and an output, such that the input of the INV 435 is coupled to the output of the NAND gate 430. In addition, the gate terminal of the PMOS transistor 415 is coupled to the output of the INV 435 to receive the DBL precharge signal which renders precharging of the DBL 140 to go high.

Further as shown in FIG. 4, the second NMOS transistor (NMOS 2) 425 includes a source terminal, a drain terminal and a gate terminal. In one exemplary implementation, the drain terminal of the NMOS 2 425 is coupled to the source terminal of the NMOS 1 420, the source terminal of the NMOS 2 425 is coupled to a ground terminal, and the gate terminal of the NMOS 2 425 is coupled to the output of the INV 435 to receive the DBL discharge stop signal 445. In one example embodiment, the DBL discharge stop signal 445 is outputted at the output terminal of the INV 435.

In operation, the DBL precharge circuit 405 generates the DBL signal 140 upon receiving the DWL signal 135. In the example embodiment illustrated in FIG. 4, the DWL signal 135 is provided at the gate terminal of the NMOS 1 420. Further, the DBL generation circuit 305 forwards the DWL signal 135 with a fixed delay to the DWL reset generation circuit 310.

Further, the DBL discharge disable circuit 410 outputs the DBL discharge stop signal 445 upon receiving the reset BL signal 320 from the DWL reset generation circuit 310. In one example embodiment, the output of the INV 435 goes low and turns off the NMOS 2 425 upon receiving the reset BL signal 320 by the NAND gate 430. As a result, the DBL precharge circuit 405 stops further discharging of the DBL 140. Therefore, the DBL precharge signal 440 inputted to the PMOS 415 enables precharging of the DBL 140. Further, the generation of the reset BL signal 320 through the DWL reset generation circuit 310 is illustrated as shown in FIG. 5.

Figure 5:
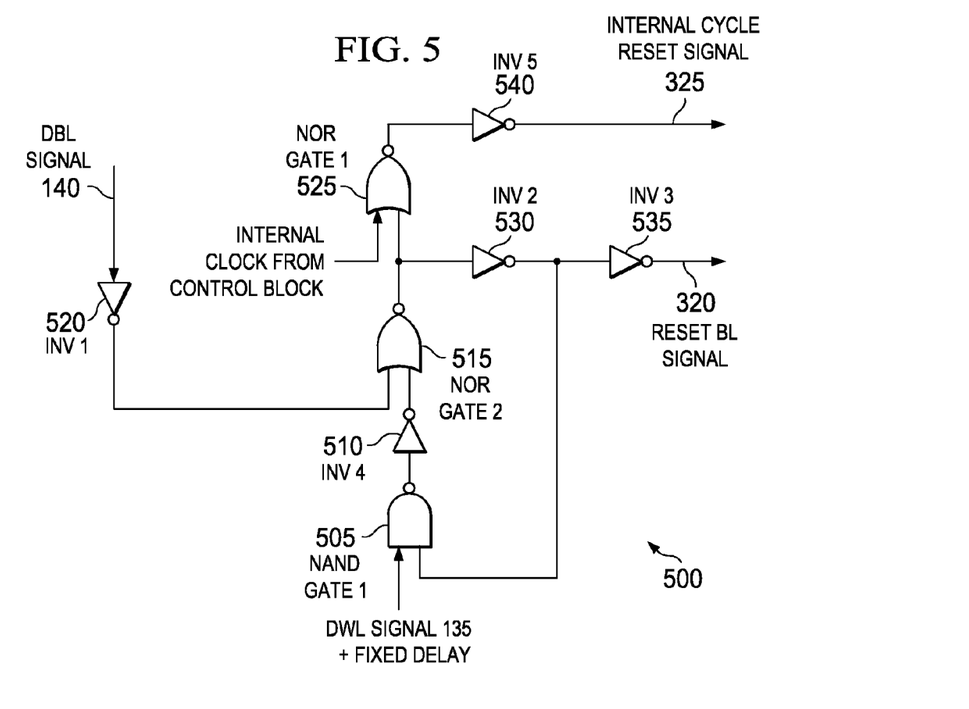
FIG. 5 is a circuit diagram of the dummy wordline (DWL) reset generation circuit of FIG. 3, according to an embodiment.

FIG. 5 is a circuit diagram 500 of the DWL reset generation circuit 310 of FIG. 3, according to an embodiment. Particularly, the DWL reset generation circuit 310 includes a first NAND gate 505, a fourth inverter (INV4) 510, a second NOR gate 515, a first inverter (INV1) 520, a first NOR gate 525, a second inverter (INV2) 530, a third inverter (INV 3) 535, and a fifth inverter (INV5) 540. Further as shown in FIG. 5, each of the first inverter (INV1) 520, second inverter (INV2) 530, third inverter (INV 3) 535, fourth inverter (INV4) 510, and fifth inverter (INV5) 540 includes an input and an output. Also, each of the first NAND gate 505, first NOR gate 515, and second NOR gate 515 includes a first input, a second input and an output.

In the exemplary implementation illustrated in FIG. 5, the input of the first inverter 520 receives the DBL signal 140 (e.g., from the DBL generation circuit 305 illustrated in FIG. 3 and FIG. 4). Also, the first input of the first NAND gate 505 receives the DWL signal 135 including a fixed delay (e.g., from the DBL generation circuit 305 illustrated in FIG. 3 and FIG. 4). Further, the output of the second inverter 530 is coupled to the input of the third inverter 535, the output of the third inverter 535 is configured to output the reset BL signal 320, and the second input of the first NAND gate 505 is coupled to the output of the second inverter 530 and input of the third inverter 535.

Further as shown in FIG. 5, the input of the fourth inverter 510 is coupled to the output of the first NAND gate 505. Also, the first input of the first NOR gate 525 receives the internal clock from the control block 115 of FIG. 3, and the second input of the first NOR gate 525 is coupled to the input of the second inverter 530.

Further as shown in FIG. 5, the first input of the second NOR gate 515 is coupled to the output of the fourth inverter 510, the second input of the second NOR gate 515 is coupled to the output of the first inverter 520, and the output of the second NOR gate 515 is coupled to the input of the second inverter 530 and the second input of the first NOR gate 525. In addition, the input of the fifth inverter 540 is coupled to the output of the first NOR gate 525, and the output of the fifth inverter 540 is configured to output the internal cycle reset signal 325.

In operation, the DBL signal 140 is inputted at the input of the first inverter 520 and the DWL signal 135 with a fixed delay is inputted at the first input of the first NAND gate 505. The DWL reset generation circuit 310 generates a reset BL signal 320 via the third inverter 535 upon the DWL signal 135 going high and DBL signal 140 going low. In one embodiment, the reset BL signal 320 stops the DBL 140 from going further low by turning off the NMOS 2 425 and triggers the DBL precharge circuit 405 to precharge the DBL 140 to go high (e.g., through the DBL precharge signal 440). In addition, the reset BL signal 320 starts the internal cycle reset signal 325 which in turn enables precharging of BLs 130. As a result, the read cycle time associated with the self timed compiler memory array 300 is reduced.

Figure 6:
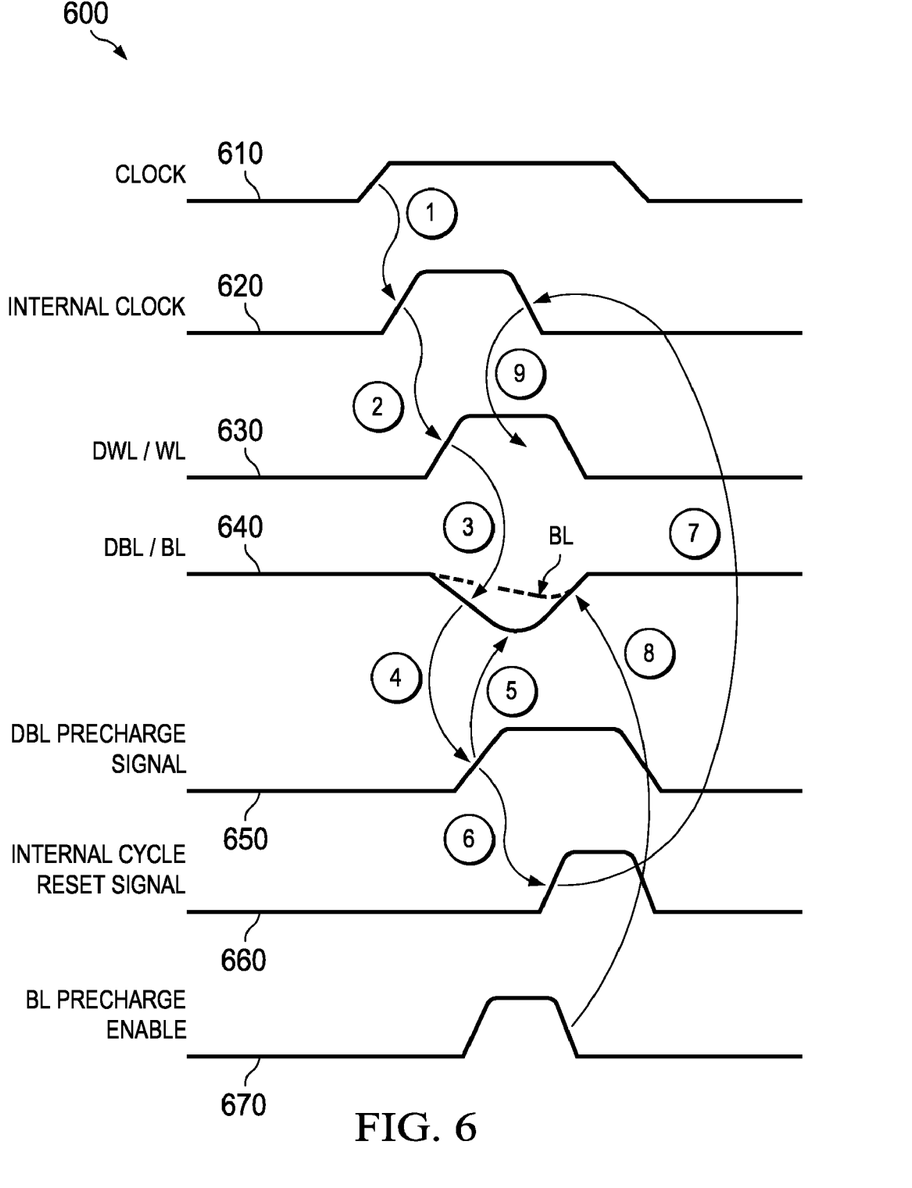
FIG. 6 is a timing diagram illustrating discharge patterns of a BL and a DBL in a read cycle of a self timed compiler memory array, such as those shown in FIG. 3, according to an embodiment.

FIG. 6 is a timing diagram 600 illustrating discharge patterns of a BL 130 and a DBL 140 in a read cycle of a self time compiler memory array 300, such as those shown in FIG. 3, according to an embodiment. The timing diagram 610 illustrates a clock cycle generated during the start of the read cycle. The timing diagram 620 illustrates the internal clock generated during the clock cycle. In one example embodiment, the internal clock is initiated during the start of the read cycle triggers the DWL 135 and WLs 125 to go high upon the internal clock going high. The timing diagram 630 depicts the DWL 135 and the WL 125 going high upon the internal clock going high.

The DWL 135 and WLs 125 in turn trigger the DBL 140 and BLs 130 to go low. The timing diagram 640 depicts the DBL 140 and the BL 130 going low when the DWL 135 and the WL 125 going high as shown in FIG. 6. It can be seen that precharging the DBL 140 back to logic high for the next read cycle takes equal time as that of precharging the BL 130 back to logic high. Further, the reset BL signal 320 is generated upon the DWL 135 going high and the DBL 140 going low.

As explained in FIG. 4, the DBL discharge disable circuit 410 generates a DBL discharge stop signal 445 or a DBL precharge signal 440 upon receiving the reset BL signal 320. The timing diagram 650 depicts the DBL precharge signal 440 generated by the DBL discharge disable circuit 410 upon the DBL 140 and the BL 130 going low. Further, the reset BL signal 320 starts an internal cycle reset signal 325 which in turn resets the internal clock (e.g., the timing diagram 620) and enables precharging of BLs 130. The timing diagram 660 depicts the internal cycle reset signal 325 generated at the end of the internal clock (e.g., the timing diagram 620). As a consequence, the DBL 140 is precharged to go high upon receiving the internal cycle reset signal 325. The timing diagram 670 depicts the BL precharge enable which stops the DBL 140 from further discharging.

It can be noted from FIG. 6, as the BLs take less time to precharge due to less change in voltage, the DBL precharge time equals the normal precharge time, thus not limiting the cycle time. In one example embodiment, the cycle time is equal to clock to precharged BL minus clock to precharge disable.

Figure 7:
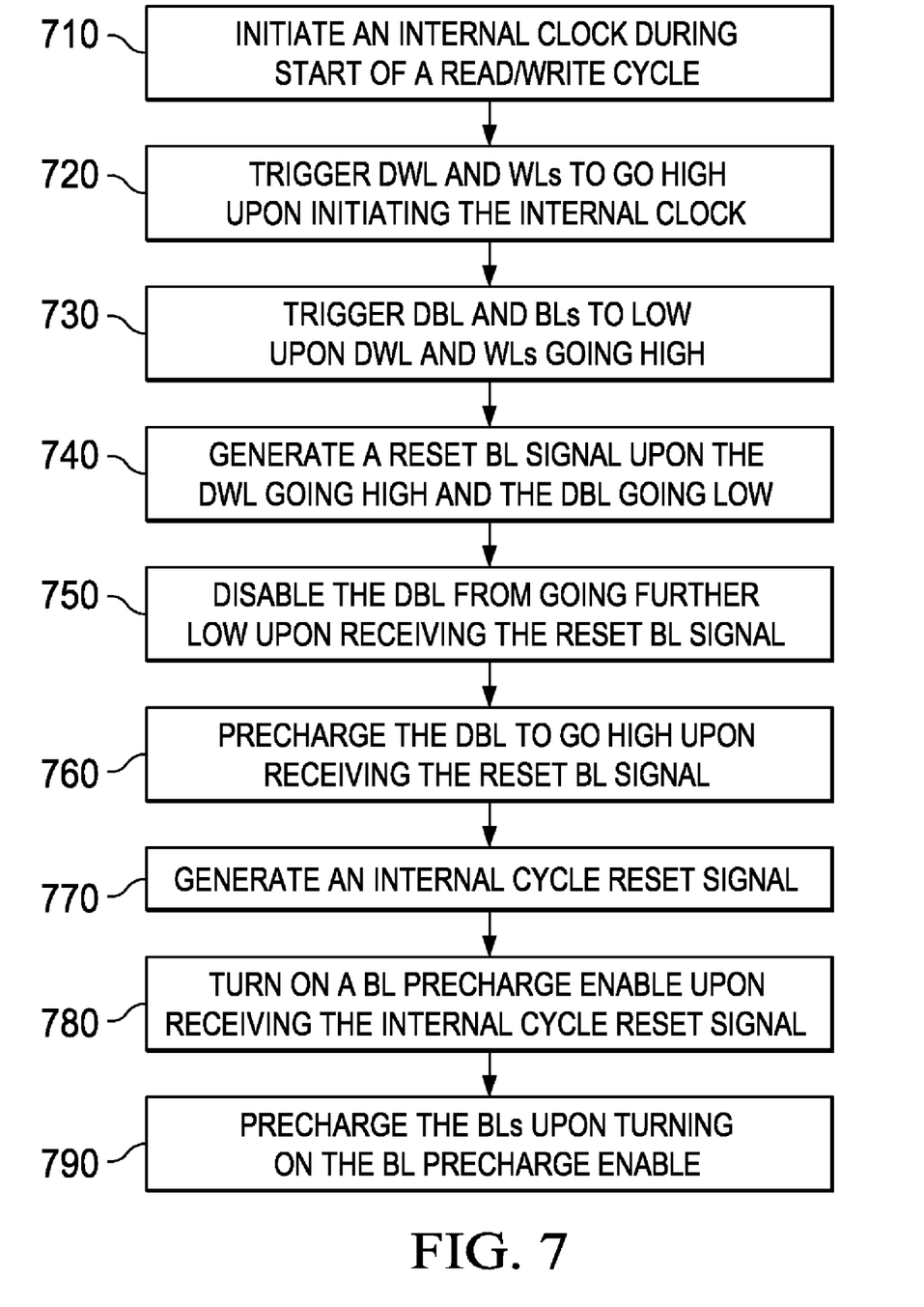
FIG. 7 is a flow chart illustrating a method of timing the precharging of BLs in a self timed compiler memory array, such as those shown in FIG. 3, according to an embodiment.

FIG. 7 is a flow chart 700 illustrating a method of timing the precharging of BLs in a self timed compiler memory array 300, such as those shown in FIG. 3, according to an embodiment. In step 710, an internal clock is initiated by a control block 115 during the start of a read/write cycle. In step 720, DWL 135 and WLs 125 are triggered to go high upon initiating the internal clock by the control block 115. In one example embodiment, the DWL 135 and the WLs 125 goes high upon the internal clock going high. In step 730, DBL 140 and BLs 130 are triggered to go low upon the DWL 135 and the WLs 125 going high by the control block 115. In step 740, a reset BL signal is generated upon the DWL 135 going high and the DBL 140 going low by the tracking circuit. In one example embodiment, the DBL generation circuit 305 generates the DBL signal 140 upon receiving the DWL signal 135. Further, the DWL reset generation circuit 310 generates the reset BL signal 320 upon receiving the DBL signal 140 and upon the DWL 135 going high.

In step 750, the DBL 140 is disabled from going further low upon receiving the reset BL signal 320 by the tracking circuit. In step 760, the DBL 140 is precharged to go high upon receiving the reset BL signal 320 by the precharge circuit 160. In step 770, an internal cycle reset signal 325 is generated. In step 780, a BL precharge enable is turned on upon receiving the internal cycle reset signal 325. In step 790, the BLs 130 are precharged upon turning on the BL precharge enable by the precharge circuit 160.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuitry (ASIC)).

What is claimed is:

1. A self timed compiler memory array, comprising:
   a memory array including a plurality of bitlines (BLs) and a plurality of wordlines (WLs);
   a peripheral logic coupled to the memory array via the BLs;
   a control block coupled to the peripheral logic for initiating an internal clock during the start of a read cycle;
   a tracking circuit including a dummy bitline (DBL) and an associated dummy wordline (DWL); and
   a precharge circuit coupled to the BLs and the DBL, wherein the DWL and the WL goes high upon the internal clock going high, which in turn triggers the DBL and the BLs to go low, wherein the tracking circuit generates a reset BL signal upon the DWL going high and DBL going low, wherein the generated reset BL signal stops the DBL from going further low and triggers the precharge circuit to precharge the DBL to go high, and wherein the reset BL signal starts an internal cycle reset signal which in turn resets the internal clock and enables precharging of BLs.

2. The self timed compiler memory array of claim 1, wherein the memory array comprises n by m array of memory cells, wherein n represents the number of rows in the memory array and m represents the number of columns in the memory array, wherein each memory cell in a column is connected to a BL and each memory cell in the row is connected to a WL.

3. The self timed compiler memory array of claim 1, wherein the tracking circuit further comprises:
   a DBL generation circuit to generate a DBL signal and the DWL signal including a fixed delay upon the internal clock going high, and the DWL going high; and
   a DWL reset generation circuit to generate the reset BL signal upon receiving the DBL signal and upon the DWL going high.

4. The self timed compiler memory array of claim 3, wherein the DBL generation circuit comprises:
   a DBL precharge circuit to output the DBL signal upon receiving the DWL signal, wherein the DBL precharge circuit includes a PMOS transistor, and a first NMOS transistor NMOS 1; and
   a DBL discharge disable circuit coupled to the DBL precharge circuit to output a DBL discharge stop signal upon receiving the reset BL signal from the DWL reset generation circuit, wherein the DBL precharge circuit to stop further discharging of the DBL upon receiving the DBL discharge stop signal from the DBL discharge disable circuit, wherein the DBL discharge disable circuit includes a NAND gate, an inverter, and a second NMOS transistor.

5. The self timed compiler memory array of claim 3, wherein the DBL generation circuit includes a DBL precharge circuit which comprises:
   a PMOS transistor having a source terminal, a drain terminal and a gate terminal, wherein the source terminal of the PMOS transistor is coupled to a positive power supply $V_{DD}$; and
   a first NMOS transistor NMOS 1 having a source terminal, a drain terminal and a gate terminal, wherein the drain terminal of the NMOS 1 is coupled to the drain terminal of the PMOS transistor, and wherein the gate terminal of the NMOS 1 to couple to receive the DWL signal.

6. The self timed compiler memory array of claim 5, wherein the DBL generation circuit includes a DBL discharge disable circuit which comprises:
   a NAND gate having a first input, a second input and an output, wherein the first input of the NAND gate to couple to receive the DWL signal, wherein the second input of the NAND gate to couple to receive the reset BL signal;
   an inverter INV having an input and an output, wherein the input of the INV is coupled to the output of the NAND gate, and wherein the gate terminal of the PMOS transistor is coupled to the output of the INV to receive a DBL precharge signal; and
   a second NMOS transistor NMOS 2 having a source terminal, a drain terminal and a gate terminal, wherein the drain terminal of the NMOS 2 is coupled to the source terminal of the NMOS 1, wherein the source terminal of the second NMOS transistor is coupled to a ground terminal, and wherein the gate terminal of the NMOS 2 is coupled to the output of the INV to receive a DBL discharge stop signal.

7. The self timed compiler memory array of claim 3, wherein the DWL reset generation circuit comprises:

a first inverter INV1 having an input and an output, wherein the input of the first inverter INV1 to couple to receive the DBL signal;

a first NAND gate having a first input, a second input and an output, wherein the first input to couple to receive the DWL signal including a fixed delay;

a second inverter INV2 having an input and an output;

a third inverter INV 3 having an input and an output, wherein the output of the second inverter INV2 is coupled to the input of the third inverter INV3, wherein the output of the third inverter INV3 to couple to output the reset BL signal, and wherein the second input of the first NAND gate is coupled to output of the second inverter INV2 and input of the third inverter INV3;

a fourth inverter INV4 having an input and an output, wherein input of the fourth inverter INV4 is coupled to the output of the first NAND gate;

a first NOR gate having a first input, a second input and an output, wherein the first input of the first NOR gate to couple to receive the internal clock from the control block, and wherein the second input of the first NOR gate is coupled to the input of the second inverter INV2;

a second NOR gate having a first input, second input, and an output, wherein the first input of the second NOR gate is coupled to the output of the fourth inverter INV4, wherein the second input of the second NOR gate is coupled to the output of the first inverter INV 1, and wherein the output of the second NOR gate is coupled to the input of the second inverter INV2 and the second input of the first NOR gate; and a fifth inverter INV5 having an input and an output, wherein the input of the fifth inverter INV5 is coupled to the output of the first NOR gate, and wherein the output of the fifth inverter INV5 to couple to output an internal cycle reset signal.

8. A method of timing the precharging of BLs in a self timed compiler memory array, wherein the self timed compiler memory array includes a plurality of bitlines (BLs) and a plurality of wordlines (WLs), wherein the self timed compiler memory array further includes a peripheral logic coupled to a memory array via the BLs, a control block coupled to the peripheral logic, a tracking circuit that includes a dummy bitline (DBL) and an associated dummy wordline (DWL), and a precharge circuit coupled to the BLs and the DBL, comprising:

initiating an internal clock during the start of a read/write cycle by the control block;

triggering the DWL and WLs to go high upon initiating the internal clock by the control block;

triggering the DBL and BLs to go low upon DWL and WLs going high by the control block;

generating a reset BL signal upon the DWL going high and the DBL going low by the tracking circuit;

disabling the DBL from going further low upon receiving the reset BL signal by the tracking circuit; and precharging the DBL to go high upon receiving the reset BL signal by the precharge circuit.

9. The method of claim 6, further comprising;

generating an internal cycle reset signal;

turning on a BL precharge enable upon receiving the internal cycle reset signal; and precharging the BLs upon turning on the BL precharge enable by the precharge circuit.

10. The method of claim 9, wherein generating the reset BL signal upon the DWL going high and the DBL going low by the tracking circuit and wherein the tracking circuit includes DBL generation circuit and a DWL reset generation circuit, comprises:

generating a DBL signal upon receiving the DWL signal by the DBL generation circuit; and generating the reset BL signal upon receiving the DBL signal and upon the DWL going high by the DWL reset generation circuit.

* * * * *